(12) United States Patent
Ye

(10) Patent No.: US 11,146,896 B2
(45) Date of Patent: Oct. 12, 2021

(54) MEMS MICROPHONE WITH IMPROVED CONNECTION STRUCTURE AND METHOD FOR MANUFACTURING THE SAME

(71) Applicants: ZILLTEK TECHNOLOGY (SHANGHAI) CORP., Shanghai (CN); ZILLTEK TECHNOLOGY CORP., Taiwan (CN)

(72) Inventor: Jinghua Ye, Shanghai (CN)

(*) Notice: Subject to any disclaimer, the term of this patent is extended or adjusted under 35 U.S.C. 154(b) by 0 days.

(21) Appl. No.: 16/896,913

(22) Filed: Jun. 9, 2020

(65) Prior Publication Data

US 2021/0258699 A1 Aug. 19, 2021

(30) Foreign Application Priority Data

Feb. 13, 2020 (CN) .......................... 2020100910924

(51) Int. Cl.
*H04R 19/00* (2006.01)
*H04R 19/04* (2006.01)
*B81B 7/00* (2006.01)
*B81C 1/00* (2006.01)

(52) U.S. Cl.
CPC .......... *H04R 19/04* (2013.01); *B81B 7/0006* (2013.01); *B81C 1/0023* (2013.01); *B81B 2201/0257* (2013.01); *B81B 2203/0315* (2013.01); *B81B 2207/012* (2013.01); *H04R 2201/003* (2013.01)

(58) Field of Classification Search
CPC .............. H04R 19/04; H04R 2201/003; B81C 1/0023; B81B 7/0006; B81B 2201/0257; B81B 2207/012; B81B 2203/0315
See application file for complete search history.

(56) References Cited

U.S. PATENT DOCUMENTS

2011/0293126 A1* 12/2011 Maekawa ............ H04R 19/005
381/355

* cited by examiner

*Primary Examiner* — Matthew A Eason
(74) *Attorney, Agent, or Firm* — Clement Cheng

(57) ABSTRACT

An MEMS microphone comprises a substrate; a cover covering the substrate and forming an acoustic cavity with the substrate, wherein the substrate of the acoustic cavity is provided with: an acoustic transducer disposed in a first region of the substrate; an integrated circuit chip comprising a first bonding pad and a second bonding pad, wherein the first bonding pad is connected to the acoustic transducer via lead wires, the second bonding pad communicates with a groove formed at a bottom of the integrated circuit chip; a metal connection layer is formed on a surface of the groove and a portion where the metal connection layer extends to a bottom surface of the integrated circuit chip serves as a metal connection area. The integrated circuit chip is connected to a second region of the substrate through the metal connection area.

8 Claims, 3 Drawing Sheets

MEMS MICROPHONE WITH IMPROVED CONNECTION STRUCTURE AND METHOD FOR MANUFACTURING THE SAME

BACKGROUND OF THE INVENTION

1. Field of the Invention

The invention relates to the technology field of microelectronics, and more particularly, to the technology field of MEMS (Micro-Electro-Mechanical system) microphones.

2. Description of the Related Art

Typically, the MEMS microphone has a structure as shown in FIG. 1, comprising a substrate 1, a cover 2 covering on the substrate 1 to form an acoustic cavity 8. The acoustic cavity 8 is provided with an acoustic through-hole 7 communicating with the outside. An acoustic transducer 3 and an ASIC (Application Specific Integrated Circuit) chip 4 are provided inside the acoustic cavity 8, and the ASIC chip 4 is connected to the substrate 1 via lead wires.

The above-mentioned structure has the disadvantages that parasitic factors, such as parasitic inductance, may be generated, which has a great impact on the anti-interference from the radio frequency of the manufactured MEMS microphone. Also, the presence of the lead wires may occupy space, which is not favorable to the miniaturization for the MEMS microphone.

SUMMARY OF THE INVENTION

In order to solve the above-mentioned problems in the prior art, the present invention provides a MEMS microphone with an improved connection structure and a method for manufacturing the same.

The detailed technical solutions are as follows:

a MEMS microphone with an improved connection structure, comprising: a substrate; a cover covering the substrate and forming an acoustic cavity with the substrate, wherein the substrate of the acoustic cavity is provided with:

an acoustic transducer, disposed in a first region of the substrate;

an integrated circuit chip comprising a first bonding pad and a second bonding pad, wherein the first bonding pad is connected to the acoustic transducer via lead wires, the second bonding pad communicates with a groove formed at a bottom of the integrated circuit chip, a metal connection layer is formed on a surface of the groove and a portion where the metal connection layer extends to a bottom surface of the integrated circuit chip serves as a metal connection area, and the integrated circuit chip is connected to a second region of the substrate through the metal connection area.

In the MEMS microphone with an improved connection structure according to the present invention, wherein the integrated circuit chip comprises a first semiconductor layer and a second semiconductor layer, the first semiconductor layer is provided with the first bonding pad and the second bonding pad, the groove is formed on the second semiconductor layer, the bottom of the groove communicates with the second bonding pad, the metal connection layer is formed on the surface of the groove and a portion where the metal connection layer extends to the bottom surface of the integrated circuit chip serves as the metal connection area.

In the MEMS microphone with an improved connection structure according to the present invention, wherein the second bonding pad is located at a bonding surface of the first semiconductor layer and the second semiconductor layer, and a depth of the groove is equal to that of the second semiconductor layer.

In the MEMS microphone with an improved connection structure according to the present invention, wherein an area surrounded by the metal connection area is less than that of the second region.

In the MEMS microphone with an improved connection structure according to the present invention, wherein the first bonding pad and the second bonding pad are arranged on opposite sides of the first semiconductor layer, respectively.

In the MEMS microphone with an improved connection structure according to the present invention, wherein an acoustic through-hole is disposed in the substrate or the cover.

A method for manufacturing a MEMS microphone with an improved connection structure is further provided in the present invention, comprising:

Step S1, preparing at least a substrate, an acoustic transducer, an integrated circuit chip, and a cover;

Step S2, fixing the acoustic transducer to the first region of the substrate, fixing the integrated circuit chip to the second region of the substrate, connecting the integrated circuit chip to the second region of the substrate through the metal connection area of the bottom of the integrated circuit chip;

Step S3, setting lead wires to connect an electric connection point of the acoustic transducer to the first bonding pad of the integrated circuit chip; and Step S4, arranging a cover on the substrate to form an acoustic cavity with the substrate.

In the method for manufacturing the MEMS microphone with the improved connection structure according to the present invention, wherein the manufacturing of the integrated circuit chip comprises:

Step 11, forming a first semiconductor layer and a second semiconductor pre-processing layer located at a bottom of the first semiconductor layer, respectively, wherein a first bonding pad is formed on a first surface of the first semiconductor, a second bonding pad is provided at a bonding surface of the first semiconductor layer and the second semiconductor pre-processing layer;

Step 12, grinding a bottom part of the second semiconductor pre-processing layer by a preset thickness to obtain a second semiconductor layer; Step 13, performing etching on the second semiconductor layer to form a groove in a third region, wherein a depth of the groove is equal to that of the second semiconductor layer; and Step 14, forming a metal connection layer on a surface of the groove by metal evaporation, wherein a portion where the metal connection layer extends to the bottom of the second semiconductor layer serves as the metal connection area.

In the method for manufacturing the MEMS microphone with the improved connection structure according to the present invention, an area surrounded by the metal connection area is less than that of the second region.

In the method for manufacturing the MEMS microphone with the improved connection structure according to the present invention, the groove is formed by Through Silicon Via (TSV) process.

By adopting the above-mentioned technical solutions, the present invention has the beneficial effects that in the present invention, a groove, communicating with a second bonding pad, is formed on an integrated circuit chip, and a metal connection layer is formed on the groove. The metal connection layer extends to a bottom of the integrated circuit chip to form a metal connection area. The integrated circuit chip is connected to a second region of the substrate through the metal connection area so as to allow the bottom surface of the integrated circuit chip to be electrically connected to the substrate, so that the potential parasitic factors arising from the lead wire connection method in the prior art is avoided, the performance of anti-interference from the radio frequency of the MEMS microphone is improved; the structure is more compact, and the miniaturization for the MEMS microphone is realized.

BRIEF DESCRIPTION OF THE DRAWINGS

The accompanying drawings, together with the specification, illustrate exemplary embodiments of the present disclosure, and, together with the description, serve to explain the principles of the present invention.

DETAILED DESCRIPTION

Figure 1:
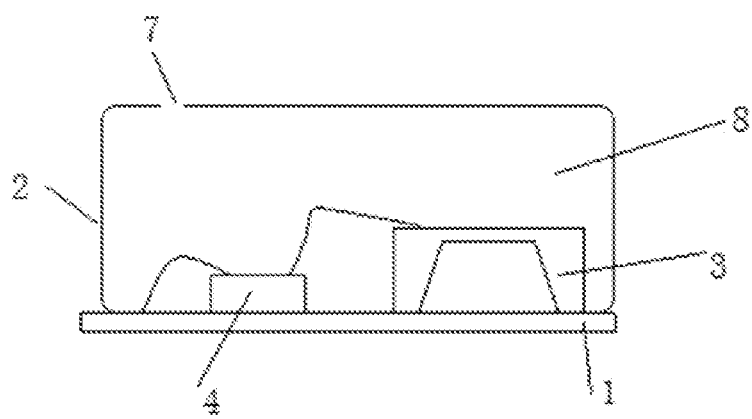
FIG. 1 is schematic diagram showing a structure of a MEMS microphone in the prior art.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout. The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, certain exemplary embodiments according to the present disclosure will be described with reference to the accompanying drawings.

Figure 2:
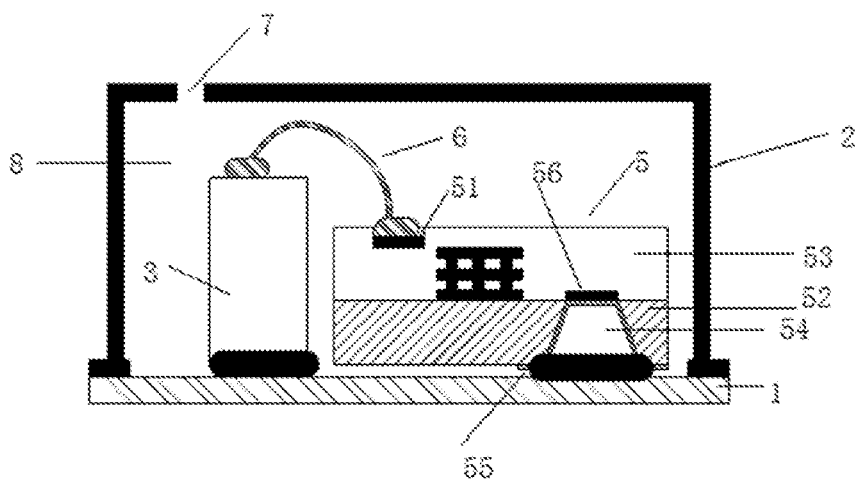
FIG. 2 is schematic diagram showing a structure of a MEMS microphone with an improved connection structure according to the present invention.

As shown in FIG. 2, a MEMS microphone with an improved connection structure, comprising: a substrate 1; a cover 2 covering the substrate 1 and forming an acoustic cavity 8 with the substrate 1, wherein the substrate 1 of the acoustic cavity 8 is provided with:

an acoustic transducer 3, disposed in a first region of the substrate 1, an integrated circuit chip 5 comprising a first semiconductor layer 53 and a second semiconductor layer 52, the first semiconductor layer 53 being provided with a first bonding pad 51 and a second bonding pad 56, wherein the first bonding pad 51 is connected to the acoustic transducer 3 via lead wires, the second bonding pad 56 is located at a bonding surface of the first semiconductor layer 53 and the second semiconductor layer 52, a groove 54 is formed on the second semiconductor layer 53, a bottom of the groove 54 communicates with the second bonding pad 56, a metal connection layer 55 is formed on the surface of the groove 54 and a portion where the metal connection layer extends to a bottom surface of the integrated circuit chip 52 serves as a metal connection area, and the integrated circuit chip 5 is connected to a second region of the substrate 1 through the metal connection area.

In the present invention, a groove, communicating with a second bonding pad, is formed on an integrated circuit chip, and a metal connection layer is formed on the groove. A portion where the metal connection layer extends to a bottom of the integrated circuit chip serves as a metal connection area. The integrated circuit chip is connected to a second region of the substrate through the metal connection area so as to allow the bottom surface of the integrated circuit chip to be electrically connected to the substrate, so that the potential parasitic factors arising from the lead wire connection method in the prior art is avoided, the performance of anti-interference from the radio frequency of the MEMS microphone is improved; the structure is more compact, and the miniaturization for the MEMS microphone is realized.

In the MEMS microphone with an improved connection structure according to the present invention, a depth of the groove 54 is equal to that of the second semiconductor layer 52. The groove 54 has a trapezoidal cross section.

In the MEMS microphone with an improved connection structure according to the present invention, an area surrounded by the metal connection area is less than that of the second region.

In the MEMS microphone with an improved connection structure according to the present invention, the first bonding pad 51 and the second bonding pad 56 are arranged on opposite sides of the first semiconductor layer 53, respectively.

In the MEMS microphone with an improved connection structure according to the present invention, an acoustic through-hole 7 is disposed in the substrate 1 or the cover 2.

Figure 3:
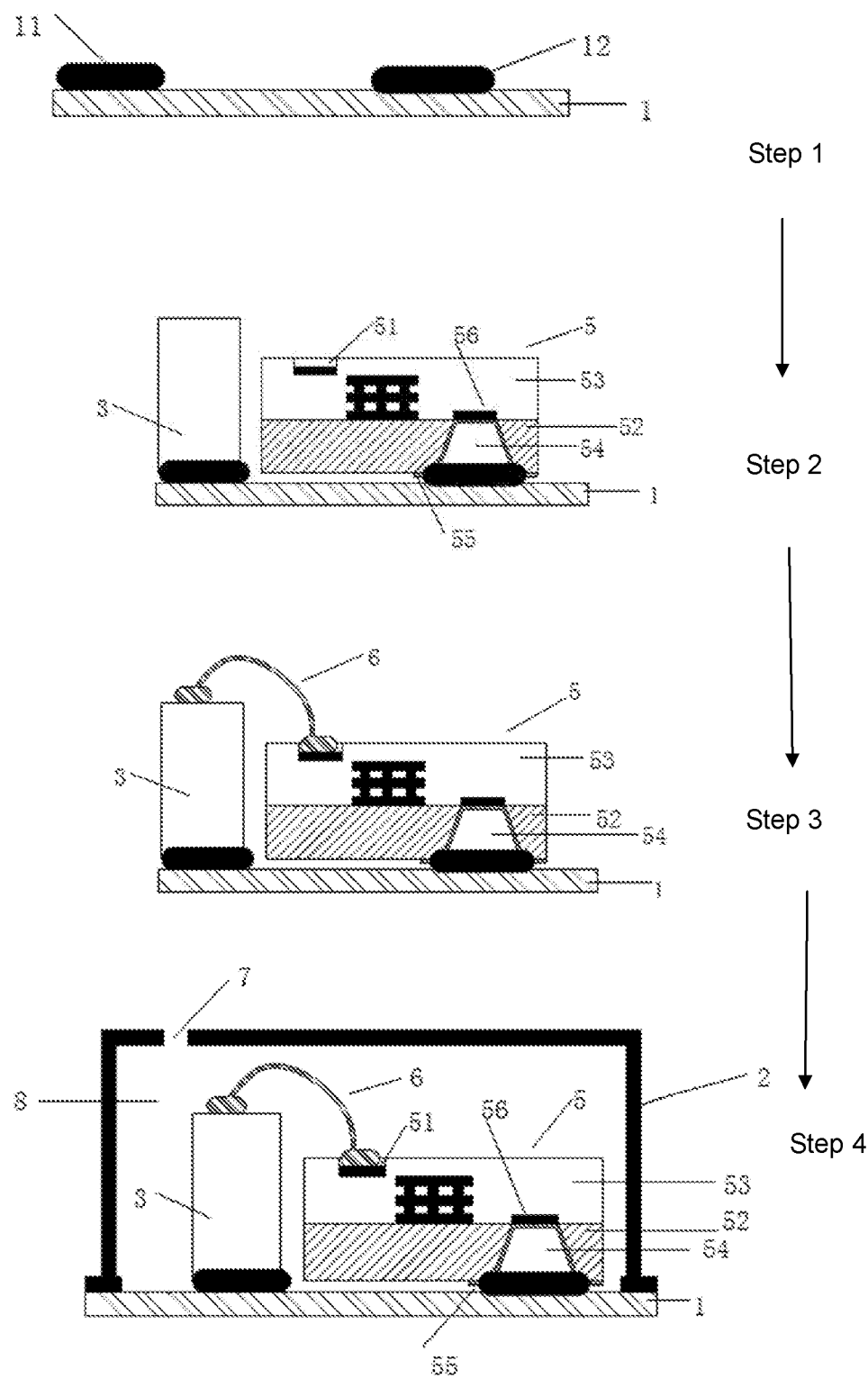
FIG. 3 is a schematic diagram showing steps of manufacturing a MEMS microphone with an improved connection structure according to the present invention.

As shown in FIG. 3, a method for manufacturing a MEMS microphone with an improved connection structure is further provided in the present invention, comprising:

Step 1, preparing at least one substrate 1, epoxy on a first region 11 of the substrate 1, solder/epoxy paste on a second region 12 of the substrate 1; Step 2, fixing the acoustic transducer 3 to the first region 11 of the substrate 1, fixing the integrated circuit chip 5 to the second region 12 of the substrate 1, connecting the integrated circuit chip 5 to the second region 12 of the substrate 1 through the metal connection area of the bottom of the integrated circuit chip;

Step S3, setting lead wires 6 to connect an electric connection point of the acoustic transducer 3 to the first bonding pad of the integrated circuit chip 5; and Step S4, arranging a cover 2 on the substrate 1 to form an acoustic cavity with the substrate 1. The cover is fixed to the substrate by reflow soldering.

Figure 4:
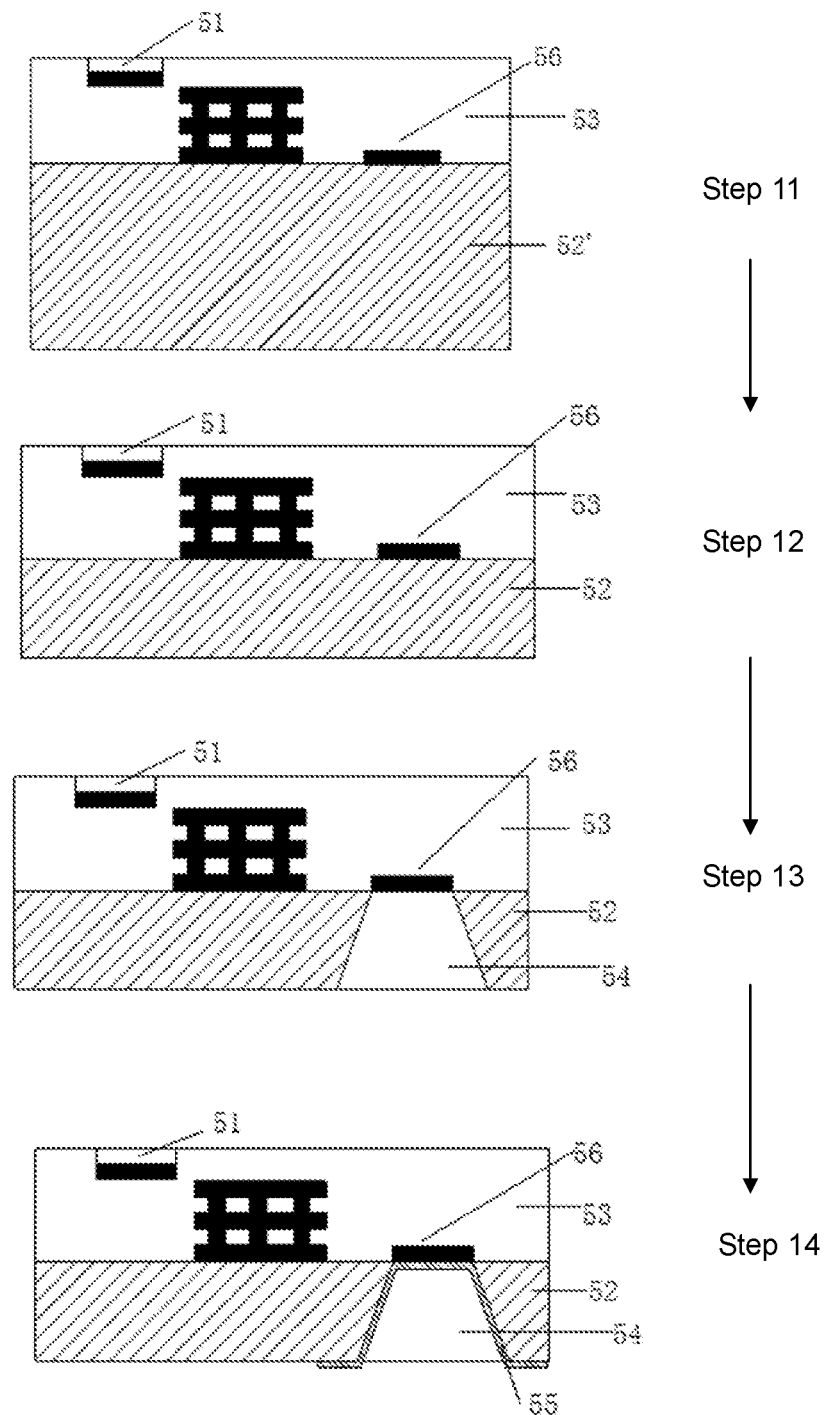
FIG. 4 is a schematic diagram showing steps of manufacturing an integrated circuit chip of a MEMS microphone with an improved connection structure according to the present invention.

In the method for manufacturing the MEMS microphone with the improved connection structure according to the present invention, as shown in FIG. 4, the manufacturing of the integrated circuit chip 5 comprises: Step 11, forming a first semiconductor layer 53 and a second semiconductor pre-processing layer 52' located at a bottom of the first semiconductor layer 53, respectively, wherein a first bonding pad 51 is formed on a first surface of the first semiconductor 53, a second bonding pad 56 is provided at a bonding surface of the first semiconductor layer 53 and the second semiconductor pre-processing layer 52';

Step 12, grinding a bottom part of the second semiconductor pre-processing layer 52' by a preset thickness to obtain a second semiconductor layer 52;

Step 13, performing etching on the second semiconductor layer 52 to form a groove 54 in a third region, wherein a depth of the groove is equal to that of the second semiconductor layer 52; and Step 14, forming a metal connection layer 55 on a surface of the groove 54 by metal evaporation, wherein a portion where the metal connection layer 55 extends to the bottom of the second semiconductor layer serves as the metal connection area. Au (aluminum) may be used to form the metal connection layer.

In the method for manufacturing the MEMS microphone with the improved connection structure according to the present invention, the groove is formed by TSV (through-silicon via). The TSV may reduce the interconnection length through vertical interconnection, so that parasitic capacitance/inductance is reduced, and miniaturization for the device may be realized.

The above descriptions are only the preferred embodiments of the invention, not thus limiting the embodiments and scope of the invention. Those skilled in the art should be able to realize that the schemes obtained from the content of specification and drawings of the invention are within the scope of the invention.

What is claimed is:

1. A MEMS (Micro-Electro-Mechanical system) microphone with an improved connection structure, comprising: a substrate; a cover covering the substrate and forming an acoustic cavity with the substrate, wherein the substrate of the acoustic cavity is provided with:
   an acoustic transducer, disposed in a first region of the substrate;
   an integrated circuit chip comprising a first bonding pad and a second bonding pad, wherein the first bonding pad is connected to the acoustic transducer via lead wires, the second bonding pad communicates with a groove formed at a bottom of the integrated circuit chip, a metal connection layer is formed on a surface of the groove and a portion where the metal connection layer extends to a bottom surface of the integrated circuit chip serves as a metal connection area, and the integrated circuit chip is connected to a second region of the substrate through the metal connection area;
   wherein the integrated circuit chip comprises a first semiconductor layer and a second semiconductor layer, the first semiconductor layer is provided with the first bonding pad and the second bonding pad, the groove is formed on the second semiconductor layer, the bottom of the groove communicates with the second bonding pad, the metal connection layer is formed on the surface of the groove and a portion where the metal connection layer extends to the bottom surface of the integrated circuit chip serves as the metal connection area.

2. The MEMS microphone with an improved connection structure of claim 1, wherein the second bonding pad is located at a bonding surface of the first semiconductor layer and the second semiconductor layer, and a depth of the groove is equal to that of the second semiconductor layer.

3. The MEMS microphone with an improved connection structure of claim 1, wherein an area surrounded by the metal connection area is less than that of the second region.

4. The MEMS microphone with an improved connection structure of claim 1, wherein the first bonding pad and the second bonding pad are arranged on opposite sides of the first semiconductor layer, respectively.

5. The MEMS microphone with an improved connection structure of claim 1, wherein an acoustics through-hole is disposed in the substrate or the cover.

6. A method for manufacturing a MEMS microphone with an improved connection structure, comprising:
   Step S1, preparing at least a substrate, an acoustic transducer, an integrated circuit chip, and a cover, wherein the manufacturing of the integrated circuit chip comprises:
      Step 11, forming a first semiconductor layer and a second semiconductor pre-processing layer located at a bottom of the first semiconductor layer, respectively, wherein a first bonding pad is formed on a first surface of the first semiconductor, a second bonding pad is provided at a bonding surface of the first semiconductor layer and the second semiconductor pre-processing layer;
      Step 12, grinding a bottom part of the second semiconductor pre-processing layer by a preset thickness to obtain a second semiconductor layer;
      Step 13, performing etching on the second semiconductor layer to form a groove in a third region, wherein a depth of the groove is equal to that of the second semiconductor layer; and
      Step 14, forming a metal connection layer on a surface of the groove by metal evaporation, wherein a portion where the metal connection layer extends to the bottom of the second semiconductor layer serves as the metal connection area;
   Step S2, fixing the acoustic transducer to the first region of the substrate, fixing the integrated circuit chip to the second region of the substrate, connecting the integrated circuit chip to the second region of the substrate through the metal connection area of the bottom of the integrated circuit chip;
   Step S3, setting lead wires to connect an electric connection point of the acoustic transducer to the first bonding pad of the integrated circuit chip; and
   Step S4, arranging a cover on the substrate to form an acoustic cavity with the substrate.

7. The method for manufacturing the MEMS microphone with the improved connection structure of claim 6, wherein an area surrounded by the metal connection area is less than that of the second region.

8. The method for manufacturing the MEMS microphone with the improved connection structure of claim 6, wherein the groove is formed by Through Silicon Via (TSV) process.

* * * * *